United States Patent
Koehler et al.

(10) Patent No.: US 7,463,791 B2
(45) Date of Patent: Dec. 9, 2008

(54) METHOD FOR AUTOMATIC ALIGNMENT OF TILT SERIES IN AN ELECTRON MICROSCOPE

(75) Inventors: Thomas Koehler, Norderstedt (DE);
Thomas Netsch, Hamburg (DE);
Kerstin Stockmeier, Tübingen (DE)

(73) Assignee: FEI Company, Hillsboro, OR (US)

( * ) Notice: Subject to any disclaimer, the term of this patent is extended or adjusted under 35 U.S.C. 154(b) by 752 days.

(21) Appl. No.: 10/733,741

(22) Filed: Dec. 10, 2003

(65) Prior Publication Data
US 2004/0119016 A1 Jun. 24, 2004

(30) Foreign Application Priority Data
Dec. 11, 2002 (EP) .................................. 02080689

(51) Int. Cl.
G06K 9/32 (2006.01)
G06K 9/62 (2006.01)
G06K 9/00 (2006.01)
(52) U.S. Cl. ..................... 382/294; 382/209; 382/151
(58) Field of Classification Search ................. 382/294, 382/209, 151
See application file for complete search history.

(56) References Cited
U.S. PATENT DOCUMENTS
2003/0100998 A2 * 5/2003 Brunner et al. ............... 702/19

OTHER PUBLICATIONS

Brandt et al. ("Automatic Alignment of Electron Tomography Images Using Markers", Intelligent Robots and Computer Vision XIX, SPIE Preceding Series, Nov. 2000).*

Russ (The Image Processing Handbook, CRC press, 1994, pp. 495-500).*
Ballard ("Generalizing The Hough Transform to Detect Arbitrary Shapes", Pattern Recognition, vol. 13, No. 2, pp. 111-122, 1981).*
Thomas Netsch and Heinz-Otto Peitgen, "Scale-Space Signatures for the Detection of Clustered Microcalcifications in Digital Mammograms" IEEE Transactions on Medical imaging, IEEE, Sep. 1999, vol. 18, No. 9, pp. 774-786.
G. A. Perkins et al., "Electron Tomography of Large, Multicomponent Biological Structures," Journal of Structural Biology, Academic Press, 1997, vol. 120, p. 219-227.

(Continued)

*Primary Examiner*—Matthew C Bella
*Assistant Examiner*—Randolph Chu
(74) *Attorney, Agent, or Firm*—Scheinberg & Griner, LLP; Michael O. Scheinberg; Robert McMinn

(57) ABSTRACT

It may be desirable to obtain three-dimensional information on a sample 2 to be studied in an electron microscope. Such information can be derived from a tilt series 2-$i$ of the sample and a subsequent reconstruction of the three-dimensional structure by means of a computer algorithm. For a proper reconstruction of the structure in the volume of the sample it is important that the measurement geometry be known; therefore it is important that the images be properly aligned. Therefore markers 8-$i$ (e.g. gold particles) are applied to the sample, which markers yield straight lines 10-$i$ as the sample is rotated and projections of that rotated sample are made onto one image plane. According to the invention the straight lines are recognized, which gives the possibility to identify the individual markers in the images of the tilt series, and to align those images on the basis of the information thus obtained.

9 Claims, 6 Drawing Sheets

OTHER PUBLICATIONS

Figure 1A:
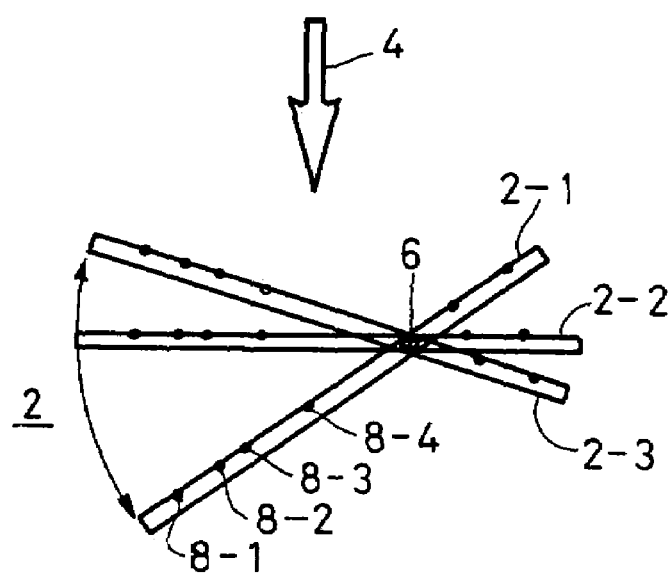

Pawel Penczek, Michael Marko, Karolyn Buttle, and Joachim Frank, "Double-Tilt Electron Tomography," Ultramicroscopy, Elsevier Science B.V., 1995, vol. 60, pp. 393-410.

Cameron H. Owen and William J. Landis, "Alignment of Electron Tomographic Series by Correlation Without the Use of Gold Particles," Ultramicroscopy, Elsevier Science B.V., 1996, vol. 63, pp. 27-38.

Yu Liu, Pawel A. Penczek, Bruce F. McEwen and Joachim Frank, "A Marker-Free Alignment Method for Electron Tomography," Ultramicroscopy, Elsevier Science B.V., 1995, vol. 58, pp. 393-402.

* cited by examiner

METHOD FOR AUTOMATIC ALIGNMENT OF TILT SERIES IN AN ELECTRON MICROSCOPE

The invention relates to a method for automatic alignment of tilt series in an electron microscope, comprising:
- applying markers to a sample to be imaged by the electron microscope;
- providing a tilt series of images of the sample;
- identifying a first set of candidate markers in each of the images in the tilt series, and
- attributing at least one probability parameter to each candidate marker in each image.

In electron microscopy it may be desirable to obtain three-dimensional information on a sample to be studied in the microscope. Such information can be derived from a tilt series of the sample and a subsequent reconstruction of the three-dimensional structure by means of a computer algorithm. In a Transmission Electron Microscope (TEM) the sample may have a thickness of a few hundred nanometers, the resolution of the microscope being a few nanometers or even less. A tilt series is a series of images of one sample in which individual images are recorded while the sample is irradiated at various angles of incidence of the electron beam exposing the sample, e.g. a series of 141 images in a tilt interval from −70° to +70° in steps of 1°. For a proper reconstruction of the structure in the volume of the sample, in particular at high resolutions, it is important that the measurement geometry be known; therefore it is important that the images be properly aligned. Lack of alignment of the individual pictures may occur, for example, due to temperature drift of the microscope during data acquisition, sample shrinkage or due to mechanical imperfections of the sample stage and the tilt mechanism, as a result of which the stage position cannot be determined with nanometer accuracy.

In a known method for alignment of images in tilt series, marker particles, e.g. gold particles having a size of typically a few tens of nanometers, are applied to the sample. Each marker particle appears in each image of the tilt series, thus offering a position reference for each image. Because of the great number of images in a tilt series these markers should preferably be recognized and identified automatically. Algorithms for automatically recognizing markers in an image have the ability to indicate a structure in an image as a marker without providing surety that such structure is indeed a marker. For this reason the indicated structure is labelled as a candidate marker, with some probability that such labelled structure is indeed a marker.

A method for identifying a set of candidate markers in an image and for attributing at least one probability parameter to each candidate marker in the image is known from an article entitled "Scale-Space Signatures for the Detection of Clustered Microcalcifications in Digital Mammograms", IEEE Transactions on Medical Imaging, Vol. 18, No. 9, September 1999, pp.774-786. This article describes the way in which candidate markers are found in an image: see, for example, section III, subsection C of the article. Also, how to attribute a reliability parameter may be derived from this article: see, for example, section IIIC, FIG. 9 and the corresponding description on page 779 left column, first full section, in which the size and the contrast are used to decide whether or not an indicated structure is recognized. No further indications for recognizing markers can be derived from this article.

It is an object of the invention to provide a method for automatically aligning tilt series in an electron microscope by recognizing markers in the sample to be studied. According to the invention this object may be satisfied in that the method further comprises:
- selecting a second set as a subset of candidate markers from the first set of candidate markers on the basis of said at least one probability parameter;
- projecting the candidate markers in the second set onto a sole image;
- applying a fitting algorithm to determine a set of parallel straight lines or very elongate ellipses best fitting the candidate markers in the sole image;
- aligning the images in the tilt series on the basis of the identified candidate markers.

In the method of finding the markers in the images of the tilt series one may start by identifying candidate markers in each of the images in the tilt series in a rough manner. When applying this rough selection method, many candidate markers that are not real markers (false positive candidates) will be part of its selection result. By applying the selection step on the basis of the probability parameter according to the invention, a lot of false positive candidates can be deleted, thus providing a higher amount of reliability in the second set of candidate markers, the second set being a subset of the first set of candidate markers. By projecting the candidate markers in the second set onto a sole image, the real markers will be situated on a set of parallel straight lines, the direction of these straight lines being perpendicular to the rotation axis used as the tilt axis in obtaining the tilt series of images of the sample. The other candidate markers (i.e. the remaining false positive ones) will be scattered in a more or less arbitrary way over the sole image obtained by the projection step. By applying a proper fitting algorithm the parallel straight lines or very elongate ellipses fitting the candidate markers in the sole image can be determined, preferably by using a computer. Sometimes it may happen that very elongate ellipses, instead of real straight lines, will occur in the sole image. This artefact is caused by the tilt axis not being exactly perpendicular to the optical axis of the electron beam. After having determined the set of straight lines, the direction of the tilt axis is known and the true markers (i.e. the ones that are situated on the set of straight lines) can be identified as such and subsequently used for aligning the images in the tilt series. This alignment may then be carried out in a manner known per se.

In a preferred embodiment of the invention the fitting algorithm used to determine the set of parallel straight lines comprises the Hough transformation. In particular in the use of a computerised recognition process for recognizing straight lines in the multitude of candidate marker points, the Hough transformation (known per se) has proven to be a reliable and stable algorithm for this recognition process.

In another embodiment of the invention the fitting algorithm used to determine the set of parallel straight lines or to determine a set of very elongate ellipses is constituted by the Generalized Hough transformation. It may happen that candidate markers belonging to one straight line are scattered in such a way that they are not aligned according to a straight line but—due to some undesirable influences—they are approximately arranged according to very elongated ellipses. In such circumstances the Generalized Hough transformation (known per se) is a good algorithm to find the directions of the long axes of the ellipses best fitting the candidate markers so arranged.

In still another embodiment of the invention a cross correlation process is applied to the images of the tilt series before identifying candidate markers in each of the images in the tilt series. One may start with a rough mutual alignment of the individual images of the tilt series, which has the effect that the projections of the markers onto the sole image are approximately situated on straight lines rather than being scattered more or less at random over the sole image; this rough first alignment step provides a concentration of the markers on the straight lines, and has the advantage that the set of straight lines found by the fitting algorithm will contain very few false positive ones. This rough first alignment step may be constituted by said cross correlation process.

In still another embodiment of the invention the probability parameter is derived from at least one of the quantities: size of the marker and local contrast of the marker. These quantities can be derived relatively easily by means of a computerized analysis of the images, and they have proved to be reliable quantities for determining—in a first selection process—whether an initially indicated structure might be identified as a candidate marker.

In an embodiment of the invention comprising the Hough transformation as the fitting algorithm used to determine the set of parallel straight lines, the fitting algorithm further comprises:
  deriving for each candidate marker a sine-shaped curve based on the coordinates of the corresponding candidate marker, according to the Hough transformation;
  deriving from the sine-shaped curves a number of histograms indicating, for each direction, the relation between the density of candidate markers and the line distance parameter according to the Hough transformation;
  applying an entropy operation to each of the histograms, resulting in a set of entropy parameters, one entropy parameter for each histogram;
  establishing the minimum value in the set of entropy parameters;
  identifying the histogram corresponding to said minimum value as the one showing the highest degree of peak diversity;
  selecting from the latter histogram a number of peaks;
  deriving from each peak position in the histogram the corresponding line distance parameter according to the Hough transformation.

The above set of technical measures describes in more detail the way in which the parameters identifying the set of straight lines containing the true marker positions are determined. Such process can be executed in a convenient way by using a computer.

Figure 1B:
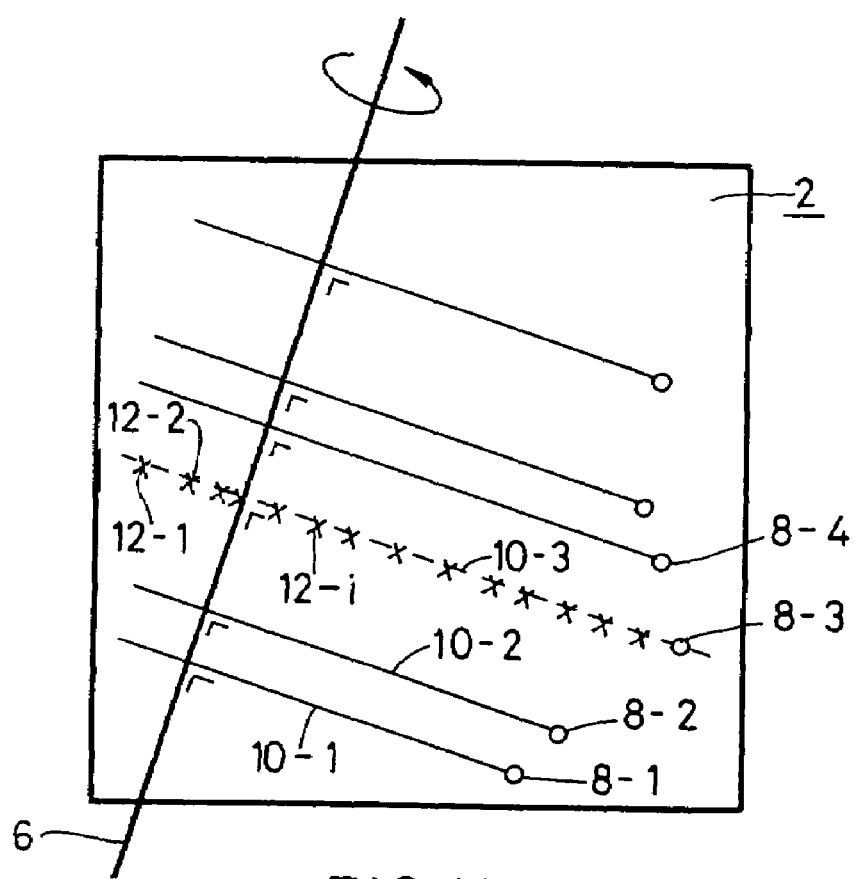
Figure 2A:
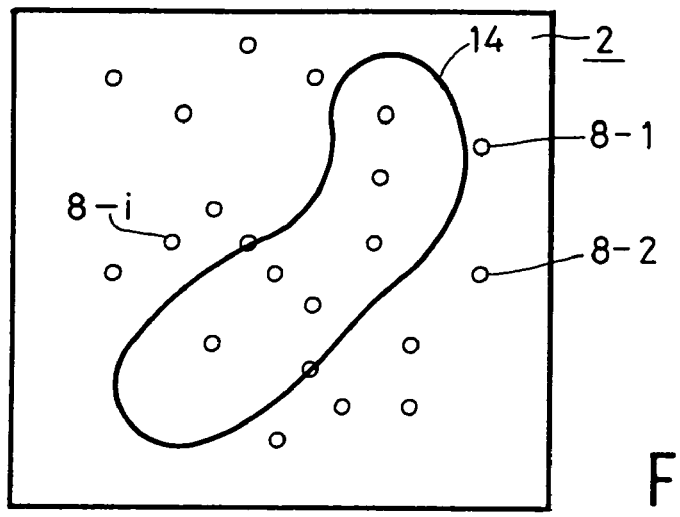
Figure 2B:
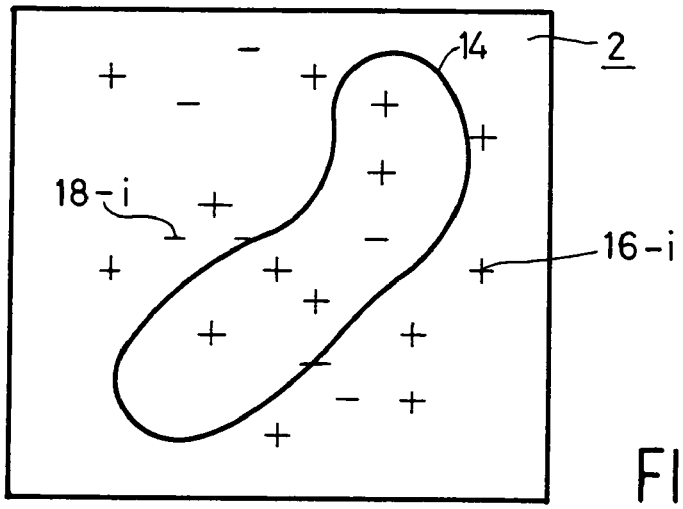
Figure 2C:
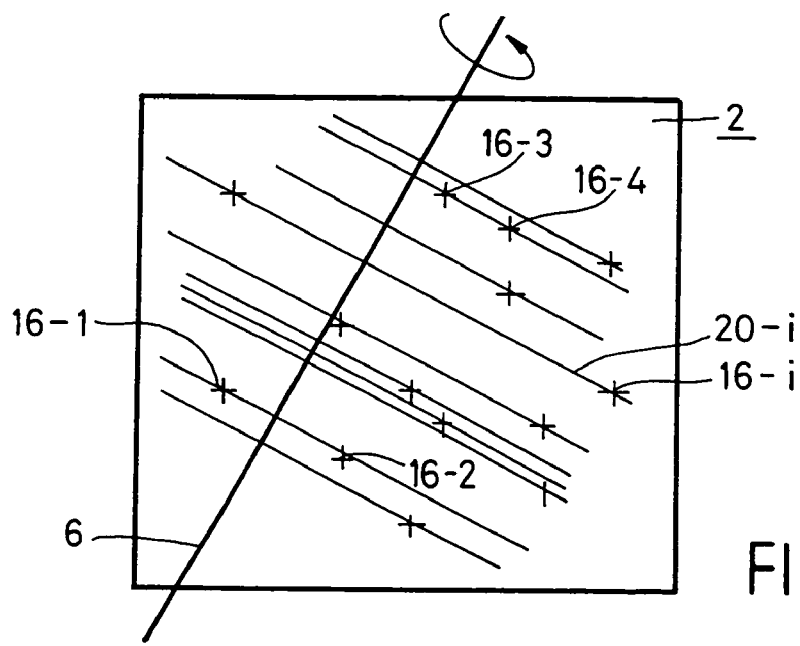
Figure 3A:
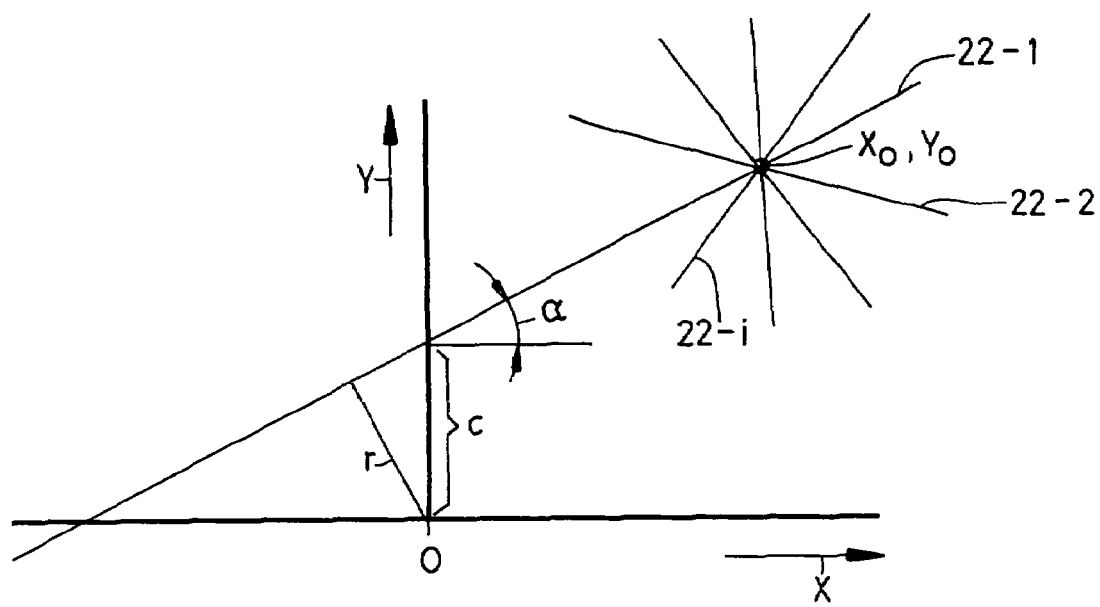
Figure 3B:
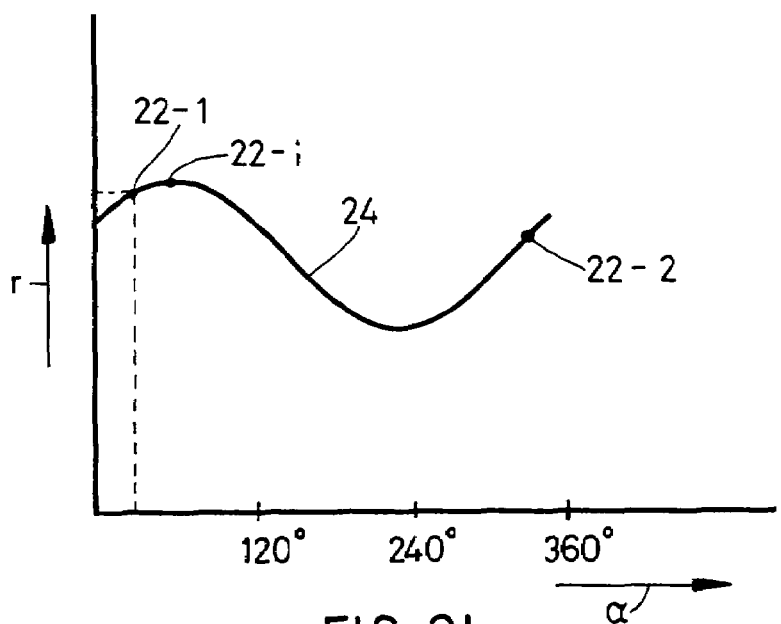
Figure 4:
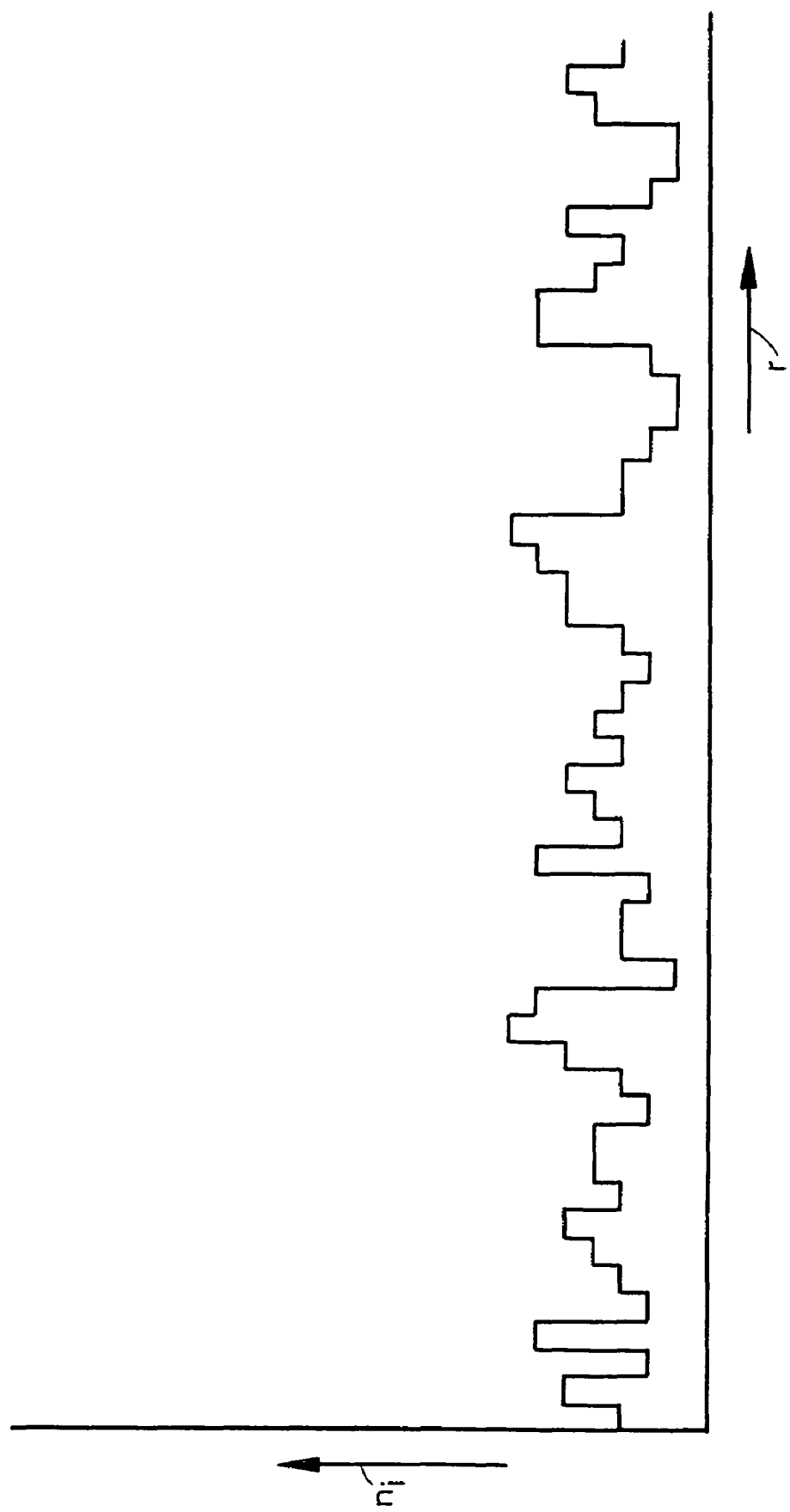
Figure 5A:
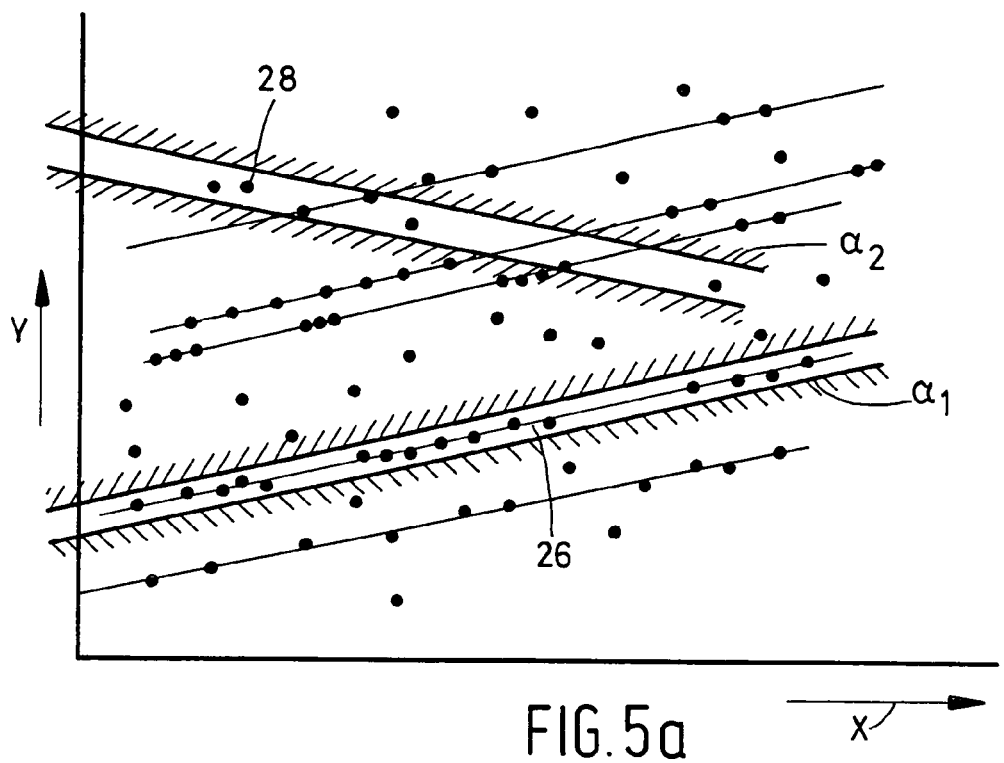
Figure 5B:
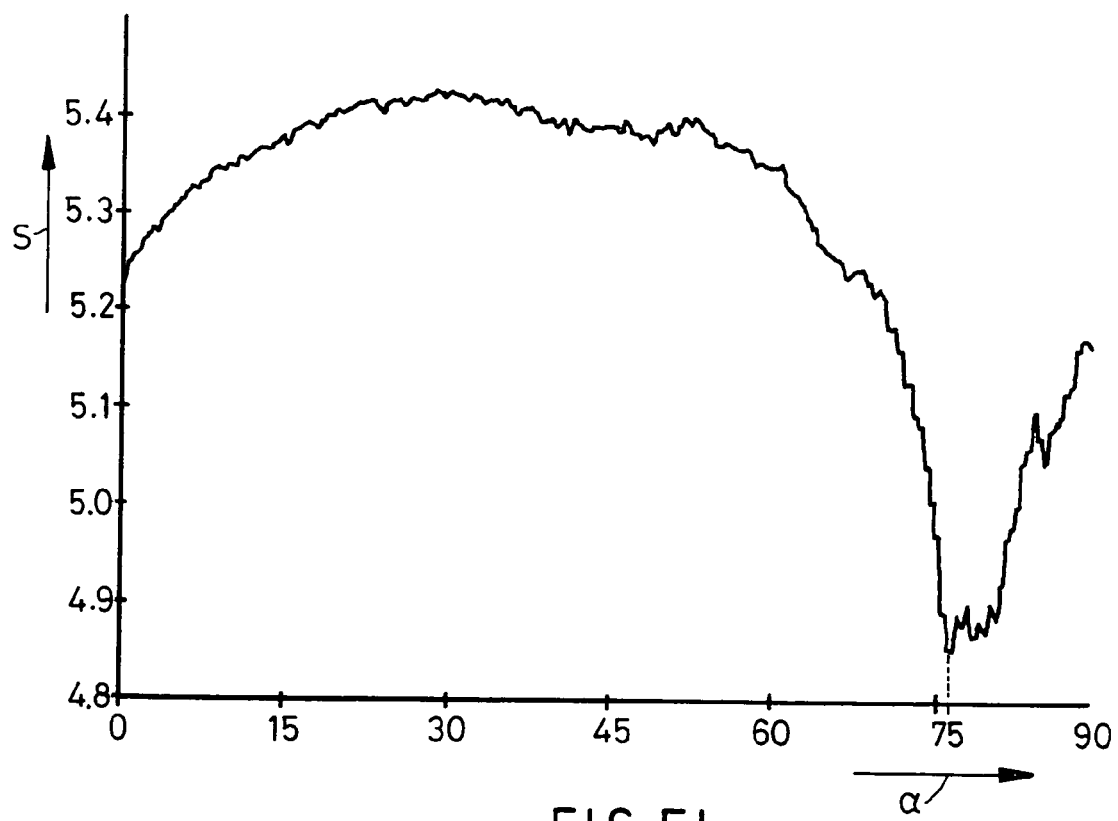
Figure 6:
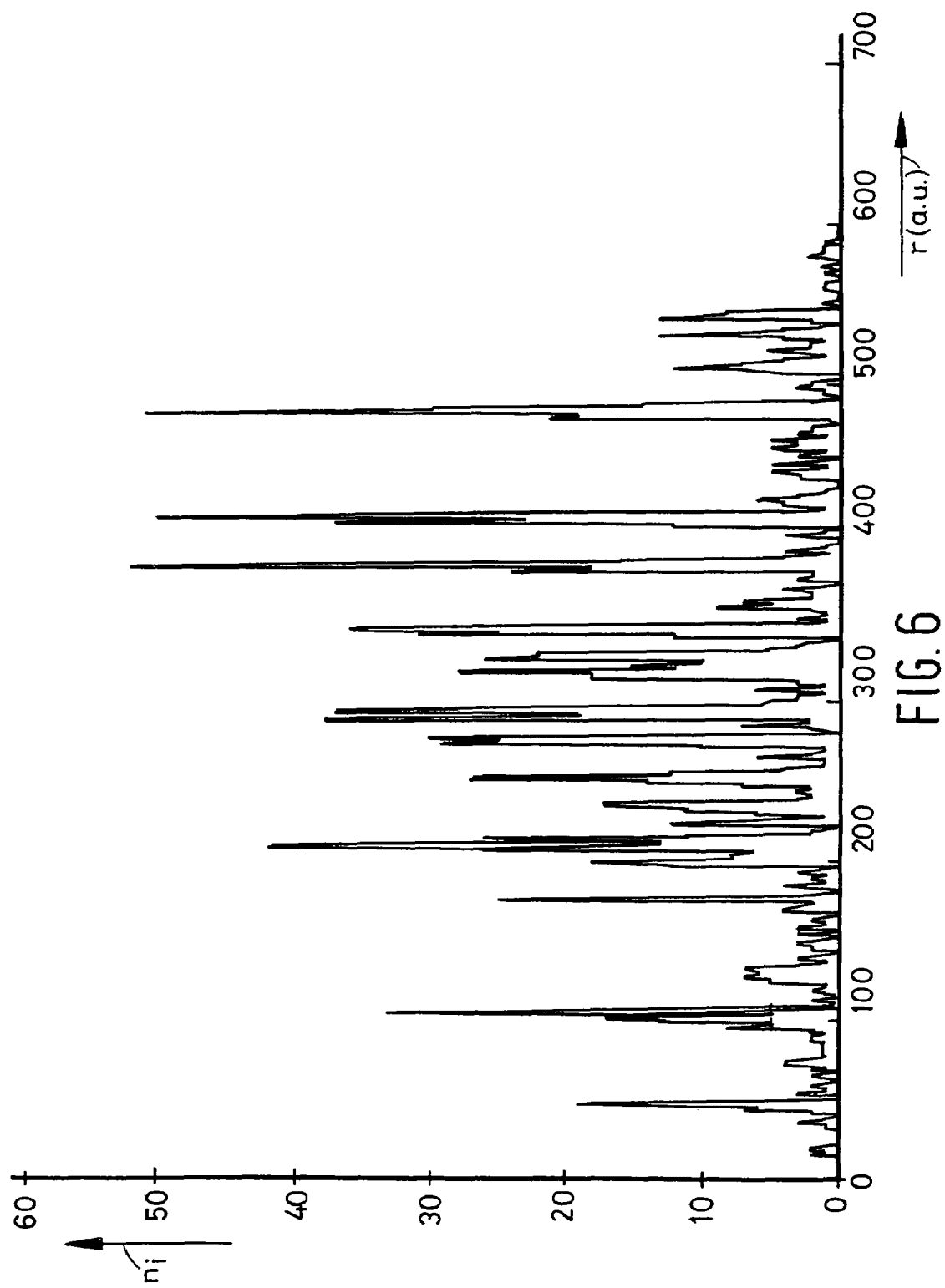

The invention will be described in more detail hereinafter with reference to the Figures, in which identical reference numerals denote corresponding elements, and wherein:

FIG. 1a: is a schematic view of a sample being exposed during a tilt series;

FIG. 1b: is a schematic image in which the markers of a tilt series are projected;

FIG. 2a: is an image of an object in which all candidate marker points are indicated;

FIG. 2b: is an image of an object in which a rough selection of marker points has been made;

FIG. 2c: represents the projection of the selected candidate markers of the tilt series;

FIG. 3a: is a graphical representation of a straight line for the purpose of explaining the application of the Hough transformation according to the invention;

FIG. 3b: is a is graphical representation of the Hough transformation of a bundle of straight lines for the purpose of explaining the application of the Hough transformation according to the invention;

FIG. 4: is a histogram representing the number of markers as seen in a first direction;

FIG. 5a: is an auxiliary figure for the purpose of explaining the selection of the line direction corresponding to the tilt axis;

FIG. 5b: is an auxiliary figure representing the peakiness of the histograms according to FIG. 4, for selecting the line direction corresponding to the tilt axis;

FIG. 6: is a histogram corresponding to the line direction of the tilt axis.

FIG. 1 shows a schematic view of a sample 2 being exposed by an electron beam 4 during a tilt series. The sample may have a thickness typically of the order of magnitude of a few hundred nanometers. During a tilt series the sample is rotated about a tilt axis 6, which in this Figure is perpendicular to the plane of drawing. The rotation takes place through some fixed angle, e.g. from −70° to +70° with steps of 1°, which means that, in such a tilt series, 141 exposures are made. The various orientations of the sample during the tilt series are indicated as 2-1, 2-2, 2-3 etc. The sample is provided in a known way with marker particles (markers) in the form of gold particles having a size of typically a few tens of nanometers. This can be done by immersing the sample in a fluid provided with a gold solution, which fluids are commercially available. After immersion of the sample in the fluid, a number of gold particles remain on the sample in such a way that they can serve as markers. These markers are indicated in the figure by reference numerals 8-1, 8-2 etc. It should be remarked that, in general, the direction of the tilt axis 6 with respect to the image of the sample is not known, e.g. because of the image rotation caused by the use of magnetic electron lenses. During rotation of the sample in a tilt series, the alignment of the sample is not known exactly, for various reasons such as temperature drift of the sample stage during the series, or play in the moving parts of the sample stage. In order to obtain a good spatial reconstruction of the image of the sample, alignment of the images of the tilt series must be possible, for which purpose the markers serve as reference points for the alignment. Therefore, any particular marker in a given image must be recognized in the other images. The invention offers an easy and reliable method of recognizing the markers in the individual images.

FIG. 1b illustrates the principle as to how the markers contribute to projected lines, such that individual markers may be recognized. The figure provides a view of the sample 2 as seen from the direction of the incident electron beam. The rotation axis 6 is located in the plane of the drawing, as well as the image plane 2 on which all markers are projected. Some markers 8-1, 8-2, 8-3, 8-4 etc. are shown in the figure. In executing a tilt series the markers 8-i are turned about the axis, thereby describing part of a circle having a plane that is perpendicular to the axis of rotation 6. The orbits of the markers along the circle are projected onto the image plane 2, which is illustrated with reference to marker 8-3. Each image i of the tilt series provides a projection 12-i on image plane 2. In ideal circumstances (no drift, no play, etc.) the set of projections 12-i are arranged along a straight line 10-3; in real circumstances the set of projections 12-i are not exactly arranged along that straight line 10-3, but more or less scattered about this line. It is an object of the invention to identify such a straight line fitting the scattered projections 12-i.

FIGS. 2a, 2b and 2c illustrate a sample to be studied by means of a tilt series. The sample 2 consists of an object 14, and is provided with gold particles as markers. These markers may be identified by applying a first (rough) selection method known per se. However, as a result of this first rough recognition step many candidate markers that are not real markers may be identified as true markers (false positive candidates). The first set of markers so obtained is represented in FIG. 2a by references 8-1, 8-2, . . . in general 8-*i*. After this first recognition step a following selection step is made; in this latter step one or two probability parameters are attributed to each candidate marker in each image, and a second set is selected as a subset of candidate markers from the first set of candidate markers on the basis of said probability parameters. The result of this selection step is represented in FIG. 2*b*, in which some markers of the first set considered to be false positive candidates are indicated by dashes 18-*i*, and the markers of the first set that are selected as true markers (the second set of markers) are indicated by crosses 16-*i*. In FIG. 2*c* the result of the projection of the true markers 16-*i* onto a single image plane 2 is illustrated. As already described with reference to FIG. 1*b* markers 16-*i* rotate about the tilt axis 6. In principle each marker will produce a rectilinear trace 20-*i* in said image plane, but some markers are positioned in such a way that their traces coincide, see, for example, marker pairs 16-1, 16-2 and 16-3, 16-4. The straight lines obtained in this way are detected by means of an algorithm comprising the Hough transformation, as will be described with reference to FIGS. 3*a* and 3*b*.

In FIG. 3*a* a straight line 22-1 is represented in a usual system of (x,y) axes. A point of this line is denoted as $x_0$, $y_0$. A bundle of straight lines all going through point $x_0$, $y_0$ is denoted in general as 22-*i*. The usual equation of such a straight line 22-1 is y=rx+c, in which r=tan($\alpha$), $\alpha$ being the angle between the line 22-1 and the positive x-axis, and c being the intersection of the line 22-1 with the y-axis. As is generally known, another representation of the line 22-1 is expressed as r=y cos($\alpha$)–x sin($\alpha$) (r being the distance from the origin x=0,y=0 to line 22-1), in which x and y represent points on the line 22-1. In this way any line containing point $x_0$, $y_0$ is expressed as r=$y_0$ cos($\alpha$)–$x_0$ sin($\alpha$), each set of values of the pair (r,$\alpha$) now indicating a line of the bundle 22-*i*. The latter expression may be represented by one point in a set of ($\alpha$,r) axes: see FIG. 3*b*. So line 22-1, having one particular value of r and of $\alpha$, is represented by one point 22-1 in FIG. 3*b*. In the same way all other lines going through point $x_0$, $y_0$ in FIG. 3*a* are represented by a point in FIG. 3*b*, all lines 22-*i* in FIG. 3*a* providing points 22-*i* in FIG. 3*b*, and all points 22-*i* together constituting a sine-shaped line 24.

A bundle of lines all going through another point $x_1$, $y_1$, in FIG. 3*a* (not drawn) will give rise to another sine-shaped line in FIG. 3*b*; if these two sine curves intersect, it means that the two points $x_0$, $y_0$ and $x_1$, $y_1$ are situated on the same line in FIG. 3*a*, which is always true for two points. Finding points that are all situated on the same line means—in terms of the Hough representation of FIG. 3*b*—that one should look for intersection points of all sine curves corresponding to those points. If these sine curves all have the same intersection point, it means that all points $x_i$, $y_i$ are situated on the same line in FIG. 3*a*.

Applying the above described algorithm to the projected marker points of FIG. 2*c* (which are not individually drawn but are represented by lines 20-*i*) means that for each candidate marker point the corresponding sine-shaped curve should be established. So, as an example, if there are 50 marker points identified as being true markers (the second set of markers) and the tilt series consists of 141 images (tilt interval from –70° to +70° in steps of 1°) then there are 50×141=7050 points in FIG. 2*c* that give rise to a sine curve as in FIG. 3*b*. To find lines in FIG. 2*b* containing a high density of marker points one should find all intersection points of all sine curves according to FIG. 3*b*. This means that for n sine curves one should calculate ½n(n–1) intersection points to be represented in FIG. 3*b*.

This calculation of all intersection points will provide the areas having a high density of intersection points in FIG. 3*b*; a high density of intersection points in FIG. 3*b* corresponds to lines containing relatively many marker points according to FIG. 2*b*.

For a numerical analysis of the density of intersection points in the ($\alpha$,r) representation the following operation is carried out. The complete interval in $\alpha$ is subdivided into (equal) small intervals $\Delta\alpha$ around each value of $\alpha$ (that particular value of $\alpha$ being denoted as $\alpha_0$). For each value of $\alpha_0$ a histogram is formed, which means that the distribution of the number of markers for all values of r is determined. The result of this operation is a collection of histograms equal in number to the number of intervals into which $\alpha$ is subdivided. One such histogram is represented in FIG. 4. It should be noted that the distribution of the numbers of markers over the various values of r is not very divergent, which means that translating a small window (width $\Delta r$) at a value of $\alpha_0$ in the direction of r does not result in a large variation in the numbers of markers that appear together in the window. A graphic representation of the latter operation is illustrated in FIG. 5*a*. FIG. 5*a* shows the x,y system in which all (projections of) markers are placed. Finding the directions in which concentration lines of markers are present involves defining a window having width $\Delta r$ and some direction $\alpha$. Two windows 26 and 28 are drawn, window 26 having direction $\alpha_1$ and window 28 having direction $\alpha_2$. It can be seen from FIG. 5*a* that the direction of concentration lines of markers coincides with direction $\alpha_1$. When window 28 is translated across the x,y system, one observes that there are no areas in that x,y system exhibiting concentrations of markers, so the histogram formed by this operation will not show a high degree of variation in the numbers of markers observed in that window, i.e. at the various values of r. The same holds for most other possible directions of such a window. However, translating window 26 having direction $\alpha_1$ results in the passage of the window over the concentration lines having the same direction $\alpha_1$, which will result in relatively many markers being detected in that window at the corresponding value of r, alternated by areas in which relatively few markers appear in the window. Such a distribution is illustrated in FIG. 6, to be discussed later with reference to that Figure.

The above graphical operation for finding the concentration lines of markers will now be described in a mathematical way suitable for application in a computer. For all values of $\alpha$, a histogram r,n (i.e. the number of markers n versus the distance parameter r)

is formed. Each histogram is subjected to an entropy calculation according to the following expression:

$$S = -\sum_{i=1}^{i=N} \left(\frac{n_i}{N}\right) \ln\left(\frac{n_i}{N}\right) \quad (1)$$

in which expression S is the entropy to be calculated, $n_i$ is the number of markers detected at some value of the distance $r_i$, N is the total number of markers in the histogram for which S is to be calculated, M is the number of intervals $\Delta\alpha$ and "ln" means the natural logarithm, which is the logarithm to the base e, where e is approximately equal to 2.718 . . . . The quantity S is, as is generally known, a measure of the divergence of the distribution of the numbers of markers over the various values of r; in other words S is a measure of the "peakiness" of the histogram. Now all histograms are subjected to a calculation to obtain the value of S according to the above expression, and this range of values is represented as a function of the direction $\alpha$ in FIG. 5b. It should be noted that a low value of S in this FIG. 5b means that the histogram belonging to it has a high "peakiness". In FIG. 5b the minimum value of S (corresponding to the maximum "peakiness") occurs at $\alpha=77°$, so that one may assume this to indicate the value of the direction perpendicular to the tilt axis with respect to the chosen system of (x,y) axes.

FIG. 6 shows the histogram corresponding to the extremal value of S referred to above, i.e. the line direction perpendicular to the tilt axis. Comparing the histogram according to FIG. 6 with the histogram of FIG. 4 it is clear that the first histogram is much more "peaky", and thus has a very high probability of being the one that corresponds to the direction perpendicular to the tilt axis. From FIG. 6 one may identify the various parallel lines of markers as schematically depicted in FIG. 1b, 2c or 5a. Once the various lines have been identified it is easy to identify the various positions of the projection of the single markers that gave rise to the relevant line (all other candidate markers being classified as false positive ones), and based thereon to mutually align the individual images of the tilt series. Such alignment is known per se to the person skilled in the art.

The invention claimed is:

1. A method for automatic alignment of tilt series in an electron microscope, comprising:
    applying markers to a sample to be imaged by the electron microscope;
    providing a tilt series of images of the sample;
    identifying a first set of candidate markers in each of the images in the tilt series;
    attributing at least one probability parameter to each candidate marker in each image;
    characterized in that the method further comprises:
    selecting a second set as a subset of candidate markers from the first set of candidate markers on the basis of said at least one probability parameter;
    projecting the candidate markers in the second set onto a sole image;
    applying a fitting algorithm to determine a set of parallel straight lines or very elongate ellipses best fitting the candidate markers in the sole image to identify a third subset of candidate markers;
    aligning the images in the tilt series on the basis of the third subset of identified candidate markers.

2. A method according to claim 1 in which the fitting algorithm used to determine the set of parallel straight lines comprises the Hough transformation.

3. A method according to claim 1 in which the fitting algorithm used to determine the set of parallel straight lines or to determine a set of very elongate ellipses is constituted by the Generalized Hough transformation.

4. A method according to claim 1 in which, before identifying candidate markers in each of the images in the tilt series, a cross correlation process is applied to the images of the tilt series.

5. A method according to claim 1 in which the probability parameter is derived from at least one of the quantities: size of the marker and local contrast of the marker.

6. A method for automatic alignment of tilt series in an electron microscope, comprising:
    applying markers to a sample to be imaged by the electron microscope;
    providing a tilt series of images of the sample;
    identifying a first set of candidate markers in each of the images in the tilt series;
    attributing at least one probability parameter to each candidate marker in each image;
    characterized in that the method further comprises:
    selecting a second set as a subset of candidate markers from the first set of candidate markers on the basis of said at least one probability parameter;
    projecting the candidate markers in the second set onto a sole image;
    applying a fitting algorithm to determine a set of parallel straight lines or very elongate ellipses best fitting the candidate markers in the sole image to identify a third subset of candidate markers, the fitting algorithm including:
        deriving for each candidate marker in the second set a sine-shaped curve based on coordinates of the corresponding candidate marker, according to the Hough transformation;
        deriving from the sine-shaped curves a number of histograms indicating, for each direction, the relation between the density of candidate markers and the line distance parameter according to the Hough transformation;
        applying an entropy operation to each of the histograms, resulting in a set of entropy parameters, one entropy parameter for each histogram;
        establishing the minimum value in the set of entropy parameters;
        identifying the histogram corresponding to said minimum value as the one showing the highest degree of peak diversity;
        selecting from the latter histogram a number of peaks; and
    deriving from each peak position in the histogram the corresponding line distance parameter according to the Hough transformation.

7. A method according to claim 2 in which the probability parameter is derived from at least one of the quantities: size of the marker and local contrast of the marker.

8. A method according to claim 3 in which the probability parameter is derived from at least one of the quantifies: size of the marker and local contrast of the marker.

9. A method according to claim 4 in which the probability parameter is derived from at least one of the quantities: size of the marker and local contrast of the marker.

* * * * *